United States Patent [19]
Sun

[11] Patent Number: 6,144,682
[45] Date of Patent: Nov. 7, 2000

[54] SPATIAL ABSORPTIVE AND PHASE SHIFT FILTER LAYER TO REDUCE MODAL REFLECTIVITY FOR HIGHER ORDER MODES IN A VERTICAL CAVITY SURFACE EMITTING LASER

[75] Inventor: Decai Sun, Sunnyvale, Calif.

[73] Assignee: Xerox Corporation, Stamford, Conn.

[21] Appl. No.: 09/183,908

[22] Filed: Oct. 29, 1998

[51] Int. Cl.[7] .................................................... H01S 5/00
[52] U.S. Cl. .................................. 372/45; 372/46; 372/96
[58] Field of Search ................................ 372/45, 46, 96; 438/32

[56] References Cited

U.S. PATENT DOCUMENTS

| 5,115,441 | 5/1992 | Kopf et al. | 372/45 |
| 5,805,624 | 9/1998 | Yang et al. | 372/45 |
| 5,879,961 | 3/1999 | Scott | 438/32 |
| 5,963,576 | 10/1999 | Claisse et al. | 372/96 |
| 6,021,146 | 2/2000 | Jiang et al. | 372/46 |

OTHER PUBLICATIONS

Morgan et al., "Transverse Mode Control of Vertical–Cavity Top–Surface–Emitting Lasers", *IEEE Photonics Technology Letters*, vol. 4, No. 4, Apr. 1993, pp. 374–377.

*Primary Examiner*—Teresa M. Arroyo
*Assistant Examiner*—Q. P. Leung
*Attorney, Agent, or Firm*—William Propp

[57] ABSTRACT

A first, thicker, annular gallium arsenide semiconductor layer surrounds a second, thinner, circular gallium arsenide semiconductor layer in a vertical cavity surface emitting laser. The thinner circular gallium arsenide layer defines the output window for the laser cavity which matches the $TEM_{00}$ fundamental mode of the light beam emitted by the active region of the VCSEL. The thicker annular gallium arsenide layer outside the output window of the thinner circular gallium arsenide layer provides modal reflectivity discrimination against high order transverse modes of the light beam emitted by the active region of the VCSEL.

16 Claims, 2 Drawing Sheets

SPATIAL ABSORPTIVE AND PHASE SHIFT FILTER LAYER TO REDUCE MODAL REFLECTIVITY FOR HIGHER ORDER MODES IN A VERTICAL CAVITY SURFACE EMITTING LASER

BACKGROUND OF THE INVENTION

This invention relates to a vertical cavity surface emitting laser ("VCSEL") and, more particularly, to a spatial absorptive and phase shift filter semiconductor layer to reduce modal reflectivity for the higher order modes in a VCSEL.

Vertical cavity surface emitting lasers are very desirable light sources for high speed laser printing, optical fiber communications and other applications. VCSELs have several advantages over edge emitting lasers including an emitted beam with a small angular divergence, a circular, anastigmatic beam and ease of fabrication into one or two dimensional arrays.

For many of these applications, a single mode output is required from the VCSEL. However, VCSELs tend to have poor spatial mode discrimination and nonuniform current injection. One of the challenges in the current state of VCSEL technology is the achievement of higher levels of output power with single mode behavior.

One means to achieve a single mode VCSEL is to reduce the reflectivity for the higher order modes within the laser aperture.

It is an object of the present invention to provide a vertical cavity surface emitting laser operating in a single mode.

SUMMARY OF THE INVENTION

The present invention provides a first, thicker, annular gallium arsenide semiconductor layer surrounding a second, thinner, circular gallium arsenide semiconductor layer in a vertical cavity surface emitting laser. The thinner circular gallium arsenide layer defines the output window for the laser cavity which matches the $TEM_{00}$ fundamental mode of the light beam emitted by the active region of the VCSEL. The thicker annular gallium arsenide layer outside the output window of the thinner circular gallium arsenide layer provides modal reflectivity discrimination against high order transverse modes of the light beam emitted by the active region of the VCSEL.

Other objects and attainments together with a fuller understanding of the invention will become apparent and appreciated by referring to the following description and claims taken in conjunction with the accompanying drawings.

DETAILED DESCRIPTION OF PREFERRED EMBODIMENTS

Figure 1:
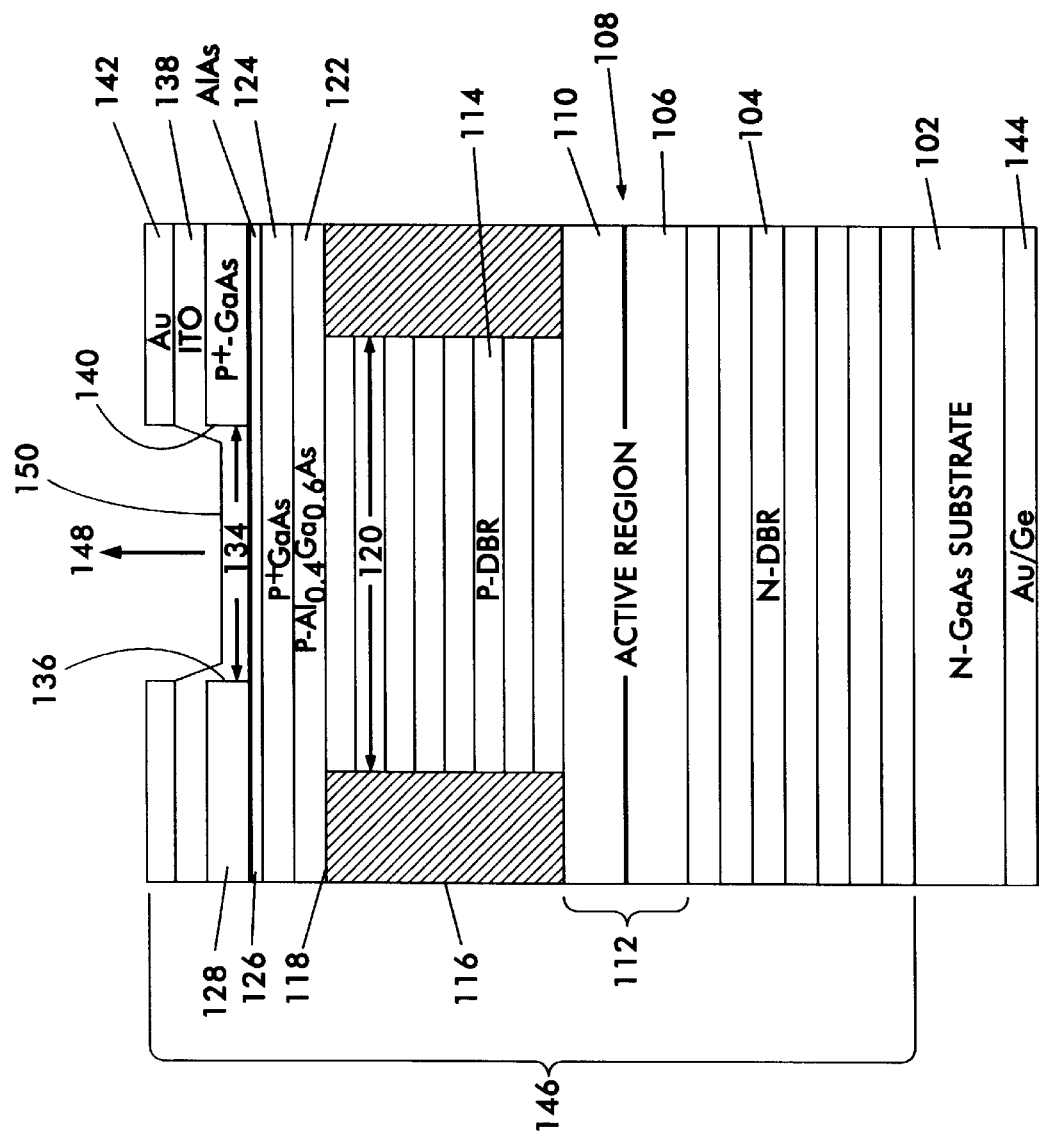
FIG. 1 is a cross-sectional side view of the semiconductor layers of the vertical cavity surface emitting laser with a spatial absorptive and phase shift filter semiconductor layer to reduce modal reflectivity for the higher order modes of the laser structure of the present invention.

FIG. 1 illustrates a vertical cavity surface emitting laser ("VCSEL") structure 100 using a gallium arsenide (GaAs) spatial absorptive and phase shift filter semiconductor layer between the p-distributed Bragg reflector and the p-electrode contact to reduce modal reflectivity for the higher order modes in a VCSEL in accordance with the present invention.

The monolithic laser structure 100 can be fabricated by a technique such as metalorganic chemical vapor deposition (MOCVD) as is well known in the art. Other deposition processes such as liquid phase epitaxy ("LPE"), molecular beam epitaxy ("MBE"), or other known crystal growth processes can also be used. In this embodiment, the VCSEL structure 100 comprises a substrate 102 of n-GaAs which is 300 µm thick and is n-doped with silicon to a doping level of approximately $5 \times 10^{18}$ cm$^{-3}$ or higher.

A lower n-distributed Bragg reflector (DBR) 104 is deposited on the n-GaAs substrate 102. The n-DBR 104 is composed of 30 pairs or more of alternating layers of $Al_{0.5}Ga_{0.5}As$ and AlAs which are n-doped with silicon to a doping level of $3 \times 10^{18}$ cm$^{-3}$. Each layer has a quarter wavelength thickness with the wavelength being the wavelength of the light emitted by the VCSEL structure 100.

A lower n-$(Al_{0.6}Ga_{0.4})_{0.5}In_{0.5}P$ confinement layer 106 is deposited on the n-DBR 104. The confinement layer 106 is 96 nm thick and undoped.

An $In_{0.6}Ga_{0.4}P$ active layer 108 is deposited on the lower confinement layer 106. The active layer 108 will emit light at approximately 670 nanometers which is in the red spectrum. The active layer 108 may be a single quantum well layer, a multiple quantum well layer or a layer with a thickness greater than that of a quantum well. The thickness of the $In_{0.6}Ga_{0.4}P$ active layer 108 is 8 nanometers.

An upper p-$(Al_{0.6}Ga_{0.4})_{0.5}In_{0.5}P$ confinement layer 110 is deposited on the active layer 108. The confinement layer 110 is 96 nm thick and undoped.

The active region 112 of the VCSEL structure 100 for emission of light comprises the two confinement layers 106 and 110 and the active layer 108.

An upper p-distributed Bragg reflector (DBR) 114 is deposited on the confinement layer 110. The p-DBR 114 is composed of 30 pairs of alternating layers of $Al_{0.5}Ga_{0.5}As$ and AlAs which are p-doped with magnesium to a doping level of $3 \times 10^{18}$ cm$^{-3}$. Each layer as a quarter wavelength thickness with the wavelength being the wavelength of the light emitted by the VCSEL structure 100.

Deep ion implantation regions 116 are formed in the p-DBR 114 by implantation of He+ or O+ ions through the top surface 118 of the p-DBR 114 by masking as is known in the art. These ion implantation regions serve to electrically and optically confine the vertical laser cavity of the VCSEL 100. The regions 116 are annular in shape and extend longitudinally down the height of the p-DBR 114. The 10 µm circular diameter 120 of the non-implanted p-DBR 114 will be the width of the laser cavity.

A p-$Al_{0.4}Ga_{0.6}As$ layer 122 is deposited on top of the p-DBR 114 and the ion implanted regions 116. The layer 122 is 220 nm thick and is doped with magnesium to a doping level of $5 \times 10^{18}$ cm$^{-3}$.

A p$^+$-GaAs cap layer 124 is deposited on top of the $Al_{0.4}Ga_{0.6}As$ layer 122. The cap layer 124 is 16 nm thick and doped with magnesium to a doping level of $1 \times 10^{19}$ cm$^{-3}$. The total thickness of these two contact layers 122 and 124 is one and a quarter of the emission wavelength of the active layer 108.

A 5 nm AlAs etch stop layer 126 is deposited on top of the first p$^+$-GaAs cap layer 124. The etch stop layer 126 is doped with magnesium to a doping level of $10^{19}$ cm$^{-3}$.

A second p+-GaAs layer 128 is deposited on top of the AlAs layer 126. The second GaAs layer 128 is 86 nm thick and doped with magnesium up to a level of $1\times10^{19}$ cm$^{-3}$. The total thickness of the AlAs etch stop layer 126 and the upper GaAs layer 128 is half of the emission wavelength of the active region.

Figure 2:
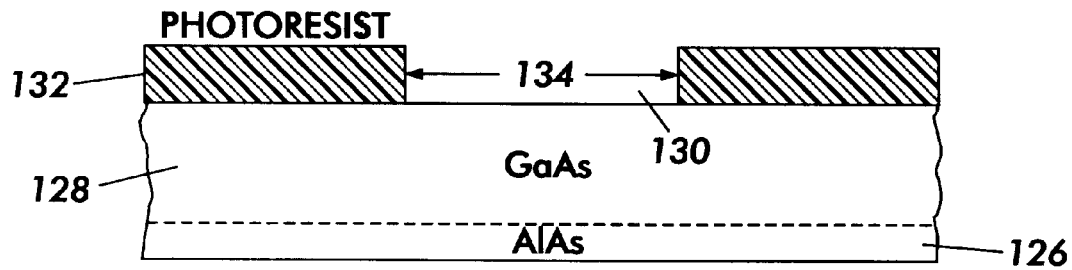
FIG. 2 is a cross-sectional side view of the spatial absorptive and phase shift filter semiconductor layer of FIG. 1 prior to etching.
Figure 3:
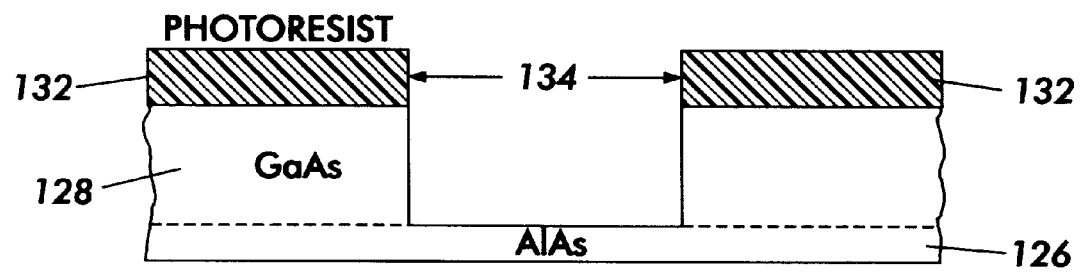
FIG. 3 is a cross-sectional side view of the spatial absorptive and phase shift filter semiconductor layer of FIG. 2 after etching.

As shown in FIG. 2, the top surface 130 of the GaAs layer 128 of the VCSEL 100 is coated with photoresist pattern 132 leaving an unmasked 5 μm diameter circle 134. As shown in FIG. 3, the GaAs layer 128 is etched by chemical wet etching, as is known in the art. The masked 132 portions of the GaAs layer 128 are uneffected while the unmasked portion 134 of the GaAs layer is etched down to the AlAs layer 126. The etching is stopped at the AlAs etch stop layer 126. After the chemical wet etching of the GaAs layer, the AlAs layer 126 in the opening 134 is etched away using diluted HF solution to the first GaAs layer 124 forming the output window 136 of the etched unmasked portion of the first GaAs layer 124. The photoresist 132 is then removed from the GaAs layer 128.

Returning to FIG. 1, the second, thicker, annular GaAs layer 128 surrounding the first, thinner circular GaAs portion 136 of the GaAs layer 124 win function as a spatial absorptive and phase shift filter semiconductor layer to reduce modal reflectivity for the higher order modes of the light beam emitted by the VCSEL 100. The first, thinner circular GaAs portion 136 of the GaAs layer 124, as noted, forms the output window of the vertical laser cavity. Also as noted, the center diameter 134 of the GaAs layer portion 136 is 5 μm.

An indium tin oxide (ITO) conductive layer 138 is deposited on the non-planar annular GaAs layer 128 and the circular GaAs layer 136. The ITO layer 138 is also deposited on the vertical sidewalls 140 of the GaAs layer 128 to the GaAs layer 136. The ITO layer 138 is 176 nm thick and is undoped.

A gold (Au) contact layer 142 is deposited only on the ITO conductive layer 138 above the GaAs layer 128. The Au layer is not deposited on the ITO layer 138 along the sidewalls 140 and the lower GaAs layer 136. The gold contact layer is 200 nm thick and undoped. The gold contact layer will function as the p-contact for the VCSEL structure 100. The gold contact layer 142 is annular having an inner diameter 134 of the output window 136 which is 5 μm.

A gold/germanium (Au/Ge) n-contact 144 is deposited on the n-GaAs substrate 102 on the side opposite from the n-DBR 104. The n-contact 144 is 200 nm thick.

The vertical laser cavity 146 comprises the n-DBR 104, the lower confinement layer 106, the active region 108, the upper confinement layer 110, the non-implanted p-DBR 114, the Al$_{0.4}$Ga$_{0.6}$As layer 122, the first, thinner GaAs layer 124 and the ITO layer 138.

Current will flow from the p-contact, the gold contact layer 142, through the ITO conductive layer 138, through the first thinner GaAs layer 124, through the non-implanted p-DBR 114, through the upper confinement layer 110, through the active region 108 to forward bias the active region to emit light, through the lower confinement layer 106, through the n-DBR 104 and through the n-substrate 102 to the n-contact, the gold/germanium layer 144. The current will cause the active region 108 to emit a coherent light beam 148 of 670 nanometer wavelength through the non-implanted p-DBR 114, the first thinner GaAs layer 124, and the surface 150 of the ITO layer 138 of the vertical laser cavity 146 of the VCSEL 100.

The 5 μm diameter 134 of the output window 136 in the thinner GaAs layer 124 matches the size of the TEM$_{00}$ fundamental mode of the light beam 148 of 670 nanometer wavelength emitted by the active region 108.

The 16 nm thick GaAs layer 124 assists the ITO conductive layer 138 in providing an even current flow for the laser cavity 146.

The thicker GaAs layer 128, outside of the output window 136, functions as a spatial absorptive and phase shift filter for mode selection for the light emitted within the laser cavity 146.

The GaAs layer 128 outside the output window 136 is 86 nm and almost half of the wavelength thick. This thickness of the layer absorbs most of the emitted light from the active region above its bandgap. This thickness of the layer also gives the light reflected from the interface of the GaAs layer 128 and the ITO layer 138 a 180 degree phase shift, causing the light to interfere destructively with the rest of the reflected light beam in the p-DBR region. Since higher-order modes extend further outside the output window, they experience more loss and are effectively suppressed.

As a result, the modal reflectivity outside the output window is lower than inside the window, the higher order modes are absorbed or destructively interfered and the TEM00 mode is selected for emission.

The gold contact layer 142 beyond the GaAs layer 128 also blocks transmission of the light beam so that light can only be transmitted through the output window.

The gold layer 142 also reflect lights within the laser cavity with a phase shift of slightly less than 90 degrees.

The half wavelength thick ITO layer 138 reflects the light with a 360 degrees of phase shift.

Thus, light reflected within the laser cavity just by the ITO layer which is light parallel to the output window 136 stays in phase and is eventually emitted. This light is just the single fundamental TEM$_{00}$ mode of light emitted by the active region.

The key novelty of this approach is that the gallium arsenide (GaAs) layer is used as a spatial absorptive filter and a phase shift filter to provide modal reflectivity discrimination against high order transverse modes so that high reflectivity and transmission is offered for the fundamental TEM00 mode only.

Alternately, the semiconductor layers 124 and 128 that form the spatial absorptive filter and a phase shift filter of the present invention can be aluminum gallium arsenide, Al$_x$Ga$_{1-x}$As, where x varies from 0.1 for infrared wavelengths to 0.25 for red wavelengths.

The ITO conductive layer 138 is used for both electrical and optical purposes. It not only assists electric current to flow into the central active region, but also provides reflection and transmission for the optical beam. Other metallic oxides such as cadmium tin oxide (CTO) may substitute for ITO.

The thinner gallium arsenide layer 124 is used to define an output window and assist in providing even current flow from the gold contact and the ITO conductive layer.

Deep ion implantation (in this case) is needed to define electric current confinement. The high resistivity, ion implanted regions 116 around the laser cavity 146 channel the current through the active region 108.

The diameter of the non-implanted p-DBR inside the implanted region can be larger than the diameter of the output window for the ease of fabrication.

The example of the VCSEL 100 of FIG. 1 is merely illustrative. By changing the composition of the semiconductor layers of the DBRs and the confinement layers and especially the active region, this approach of an ITO layer and a gold contact/spatial filter layer with an output window is suitable for red and infrared VCSELs with emission wavelength from 640 to 980 nm. The fundamental mode sees a higher reflectivity than the higher order modes. For example, the DBR can have alternating layers of $Al_{0.2}Ga_{0.8}As/AlAs$ with an $In_{0.15}Al_{0.15}Ga_{0.7}As$ active layer for an infrared VCSEL which emits light at approximately 835 nanometers.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A surface emitting laser for emitting coherent light comprising:
   a substrate;
   a plurality of semiconductor layers formed on said substrate;
   one or more of said plurality of semiconductor layers forming an active region;
   one of said plurality of semiconductor layers being a first gallium arsenide layer having a thicker annular section surrounding another of said plurality of semiconductor layers being a second gallium arsenide layer having a thinner circular section, said first annular gallium arsenide layer section suppressing reflectivity for the high orders of coherent light emitted by said active region, said thinner circular section of said second gallium arsenide layer forming an output window for the fundamental mode of coherent light emitted by said active region; and
   first and second electrodes which enable biasing of said active region to emit coherent light.

2. The surface emitting laser for emitting coherent light of claim 1 wherein said first thicker annular gallium arsenide layer section shifts the phase of said high orders of coherent light emitted by said active region to suppress the reflectivity of said high orders of coherent light emitted by said active region.

3. The surface emitting laser for emitting coherent light of claim 1 wherein said first thicker annular gallium arsenide layer section has a thickness of half of the wavelength of the coherent light emitted by said active region.

4. The surface emitting laser for emitting coherent light of claim 1 further comprising one of said plurality of semiconductor layers being a conductive oxide semiconductor layer, said conductive oxide semiconductor layer being formed on said second gallium arsenide layer.

5. The surface emitting laser for emitting coherent light of claim 4 wherein said conductive oxide semiconductor layer is indium tin oxide.

6. The surface emitting laser for emitting coherent light of claim 4 wherein said conductive oxide semiconductor layer is cadmium tin oxide.

7. The surface emitting laser for emitting coherent light of claim 1 further comprising one or more of said plurality of semiconductor layers forming a distributed Bragg reflector, said second gallium arsenide layer being formed on said distributed Bragg reflector.

8. The surface emitting laser for emitting coherent light of claim 7 further comprising ion implantation regions in said distributed Bragg reflector for optically and electrically confining a laser cavity for said coherent light emitted by said active region through said output window of said thinner circular section of said second gallium arsenide layer.

9. A surface emitting laser for emitting coherent light comprising:
   a substrate;
   a plurality of semiconductor layers formed on said substrate;
   one or more of said plurality of semiconductor layers forming an active region;
   one of said plurality of semiconductor layers being a first aluminum gallium arsenide layer having a thicker annular section surrounding another of said plurality of semiconductor layers being a second aluminum gallium arsenide layer having a thinner circular section, said first annular aluminum gallium arsenide layer section suppressing reflectivity for the high orders of coherent light emitted by said active region, said thinner circular section of said second aluminum gallium arsenide layer forming an output window for the fundamental mode of coherent light emitted by said active region; and
   first and second electrodes which enable biasing of said active region to emit coherent light.

10. The surface emitting laser for emitting coherent light of claim 9 wherein said first thicker annular aluminum gallium arsenide layer section shifts the phase of said high orders of coherent light emitted by said active region to suppress the reflectivity of said high orders of coherent light emitted by said active region.

11. The surface emitting laser for emitting coherent light of claim 9 wherein said first thicker annular aluminum gallium arsenide layer section has a thickness of half of the wavelength of the coherent light emitted by said active region.

12. The surface emitting laser for emitting coherent light of claim 9 further comprising one of said plurality of semiconductor layers being a conductive oxide semiconductor layer, said conductive oxide semiconductor layer being formed on said second aluminum gallium arsenide layer.

13. The surface emitting laser for emitting coherent light of claim 12 wherein said conductive oxide semiconductor layer is indium tin oxide.

14. The surface emitting laser for emitting coherent light of claim 12 wherein said conductive oxide semiconductor layer is cadmium tin oxide.

15. The surface emitting laser for emitting coherent light of claim 9 further comprising one or more of said plurality of semiconductor layers forming a distributed Bragg reflector, said second aluminum gallium arsenide layer being formed on said distributed Bragg reflector.

16. The surface emitting laser for emitting coherent light of claim 15 further comprising ion implantation regions in said distributed Bragg reflector for optically and electrically confining a laser cavity for said coherent light emitted by said active region through said output window of said thinner circular section of said second aluminum gallium arsenide layer.

* * * * *

UNITED STATES PATENT AND TRADEMARK OFFICE
CERTIFICATE OF CORRECTION

| | | |
|---|---|---|
| PATENT NO. | : 6,144,682 | Page 1 of 1 |
| APPLICATION NO. | : 09/183908 | |
| DATED | : November 7, 2000 | |
| INVENTOR(S) | : Decai Sun | |

It is certified that error appears in the above-identified patent and that said Letters Patent is hereby corrected as shown below:

Column 1, line 6, insert as a new paragraph:

This invention was made with Government support under Agreement No. F19628-94-C-0023 awarded by the Department of the Air Force. The Government has certain rights in this invention.

Signed and Sealed this

Eleventh Day of July, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,144,682 | Page 1 of 1 |
| APPLICATION NO. | : 09/183908 | |
| DATED | : November 7, 2000 | |
| INVENTOR(S) | : Decai Sun | |

It is certified that error appears in the above-identified patent and that said Letters Patent is hereby corrected as shown below:

Column 1, line 6, insert as a new paragraph:

This invention was made with Government support under Agreement No. F19628-94-C-0023 awarded by the Department of the Air Force. The Government has certain rights in this invention.

Signed and Sealed this

Fourteenth Day of November, 2006

JON W. DUDAS
*Director of the United States Patent and Trademark Office*